United States Patent
Wang et al.

(10) Patent No.: US 7,994,518 B2
(45) Date of Patent: Aug. 9, 2011

(54) LIGHT-EMITTING DIODE

(75) Inventors: Chun-Wei Wang, Miao-Li Hsien (TW); Hung-Kuang Hsu, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 225 days.

(21) Appl. No.: 12/202,555

(22) Filed: Sep. 2, 2008

(65) Prior Publication Data

US 2009/0146155 A1 Jun. 11, 2009

(30) Foreign Application Priority Data

Dec. 11, 2007 (CN) .......................... 2007 1 0202983

(51) Int. Cl.
*H01L 33/00* (2010.01)
(52) U.S. Cl. ...... 257/82; 257/98; 257/100; 257/E33.067
(58) Field of Classification Search .................... 257/82, 257/98, E33.067, E33.077, 99, 100
See application file for complete search history.

(56) References Cited

U.S. PATENT DOCUMENTS

| 7,329,905 | B2 * | 2/2008 | Ibbetson et al. | 257/98 |
| 2007/0295980 | A1 * | 12/2007 | Koya et al. | 257/98 |
| 2008/0246397 | A1 * | 10/2008 | Wang et al. | 313/512 |
| 2008/0284308 | A1 * | 11/2008 | Pang | 313/498 |

FOREIGN PATENT DOCUMENTS

| TW | M246811 | 10/2004 |
| TW | I249257 | 4/2006 |
| TW | 200721525 | 6/2007 |

* cited by examiner

*Primary Examiner* — Thinh T Nguyen
(74) *Attorney, Agent, or Firm* — Andrew C. Cheng

(57) ABSTRACT

An LED includes a substrate having a substantially flat substrate surface, a plurality of electrodes extending through the substrate, an LED chip configured for emitting light, a first and a second coplanar reflective layers formed on the surface, and a light pervious encapsulation member mounted on the substrate surface. The light pervious encapsulation member covers the LED chip and the first reflective layer and a portion of the second reflective layer. The LED chip is mounted on the substrate surface and electrically connected with the electrodes. The first reflective layer and the second reflective layer are configured for reflecting the light emitted from the LED chip.

20 Claims, 5 Drawing Sheets

LIGHT-EMITTING DIODE

CROSS REFERENCE TO RELATED APPLICATION

This application is related to commonly-assigned application Ser. No. 12/168,783, entitled "LIGHT EMITTING DIODE WITH AUXILIARY ELECTRIC COMPONENT". Disclosures of the above-identified application are incorporated herein by reference.

BACKGROUND

1. Field of the Invention

The present invention relates generally to light-emitting devices and more particularly to a light-emitting diode (LED).

2. Description of Related Art

Generally, an LED includes a substrate, an LED chip disposed on the substrate, and a light pervious encapsulation covering the LED chip. When the LED chip emits light, the light eventually passes through the light pervious encapsulation. Usually, a bowl or cup shaped space is defined in the substrate for receiving the LED chip. An intensity distribution of the LED can be adjusted according to the design of the bowl or cup shaped space. However, light emitted from the LED chip may be internally reflected many times within the space before passing through the light pervious encapsulation. As a result, the brightness of the LED is decreased and the luminous efficiency of the LED is degraded.

Therefore, what is needed, is a light-emitting diode with a higher luminous efficiency.

SUMMARY

An LED includes a substrate having a substantially flat substrate surface, a plurality of electrodes extending through the substrate, an LED chip configured for emitting light, a first and a second coplanar reflective layers formed on the surface, and a light pervious encapsulation member mounted on the substrate surface. The light pervious encapsulation member covers the LED chip and the first reflective layer and a portion of the second reflective layer. The LED chip is mounted on the substrate surface and electrically connected with the electrodes. The first reflective layer and the second reflective layer are configured for reflecting the light emitted from the LED chip.

BRIEF DESCRIPTION OF THE DRAWINGS

Many aspects of the present light-emitting diode can be better understood with reference to the following drawing. The components in the drawing are not necessarily drawn to scale, the emphasis instead being placed upon clearly illustrating the principles of the present light-emitting diode. Moreover, in the drawing like reference numerals designate corresponding parts throughout.

DETAILED DESCRIPTION

Reference will now be made to the drawings to describe in detail the preferred embodiments of the present light-emitting diode.

Figure 1:
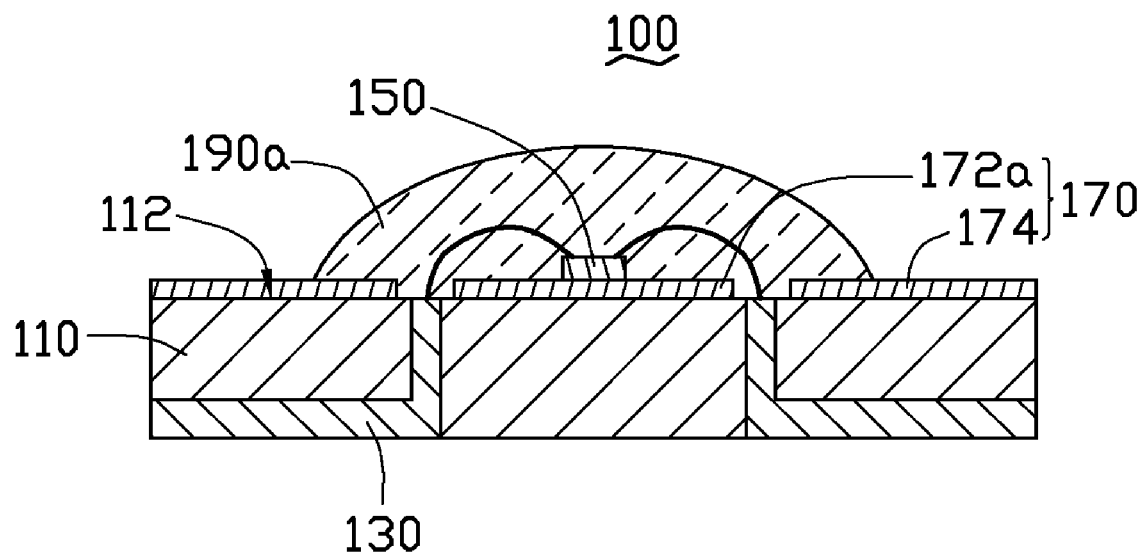
FIG. 1 is a schematic, cross-sectional view of a light-emitting diode in accordance with a first embodiment, including an LED chip mounted on a reflective surface, and a hemispherical shaped encapsulation.

Referring to FIG. 1, an LED 100 according to a first embodiment is shown. The LED 100 includes a silicon substrate 110, an LED chip 150, and a light pervious encapsulation 190a.

The silicon substrate 110 is configured for supporting the LED chip 150 and the encapsulation 190a thereon, and for dissipating heat generated from the LED chip 150. The silicon substrate 110 includes a surface 112. The surface 112 can be a flat surface.

A plurality of electrodes 130 extends through the silicon substrate 110 and is made of an electrically conductive material. The electrically conductive material can be an electrically conductive paste or a metal, such as gold, silver, aluminum and so on. In the present embodiment, each of the electrodes 130 has an L shaped cross section.

The LED chip 150 is mounted on the surface 12 of the silicon substrate 110. The silicon substrate 110 dissipates the heat generated by the LED chip 150 towards the outside of the LED 10. The LED chip 150 can be electrically connected with the electrode 130 by a wiring bonding technique.

A reflective layer 170 is formed on the surface 112 of the silicon substrate 110 for reflecting light emitted from the LED chip 150 to the encapsulation 190a. The reflective layer 170 includes a first reflective portion 172a and a second reflective portion 174. The first reflective portion 172a and the second reflective portion 174 are coplanar and formed on the surface 112 of the substrate 110. The first reflective portion 172a is sandwiched between the LED chip 150 and the surface 112. The LED chip 150 can be adhesively mounted on the first reflective portion 172a by silver ink, for example. The reflective layer 170 can be made of a reflective material. The reflective material can be a metal such as silver, aluminum, copper and so on. The reflective material also can be ceramic powder or $TiO_2$. The first reflective portion 172a and the second reflective portion 174 can be insulated with all of the electrodes 130 or at least one of the electrodes 130.

Figure 2:
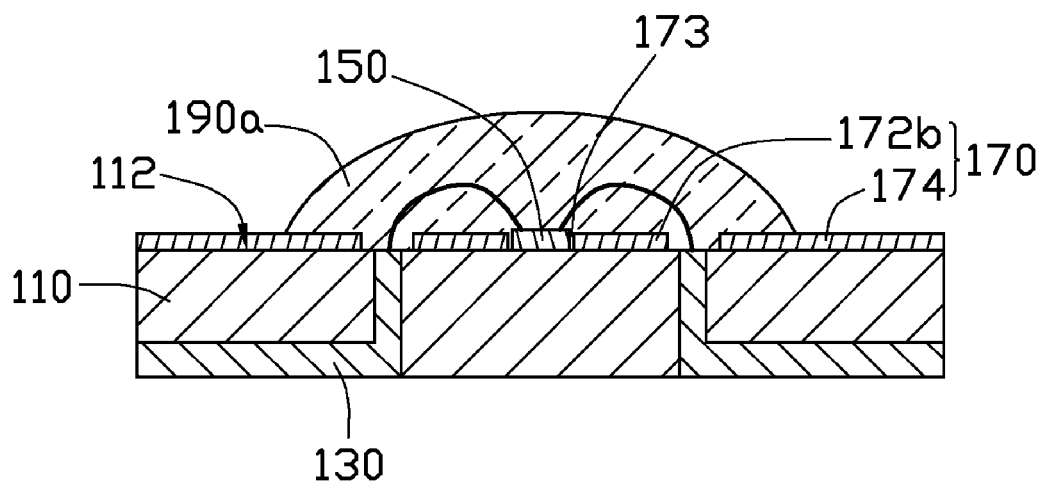
FIG. 2 is similar to FIG. 1 but with a different placement of the LED chip.

Referring to FIG. 2, a through hole 173 can be defined in the middle of the first reflective portion 172b. The LED chip 150 in the through hole 173 can be mounted directly on the first surface 112b of the silicon substrate 110. The height of the first reflective portion 172b is smaller than that of the LED chip 150.

Figure 3:
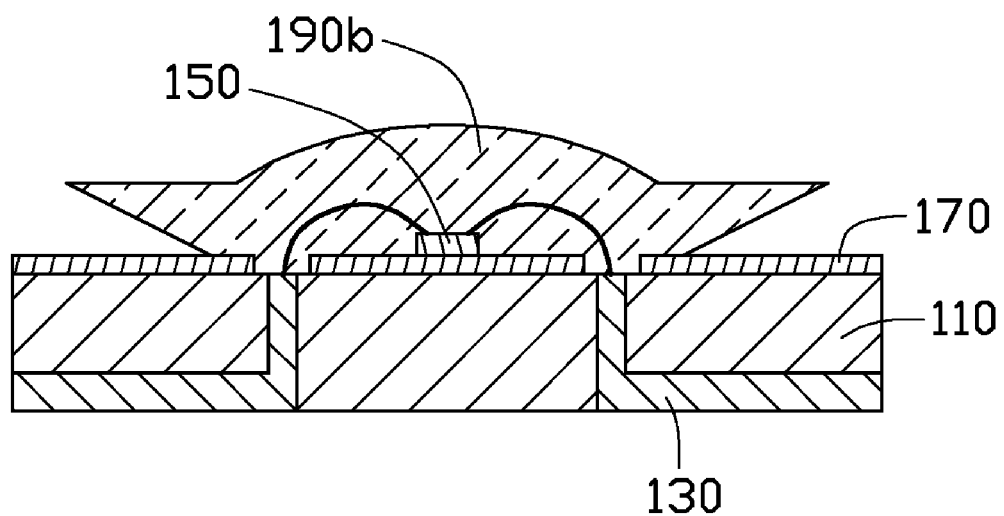
FIG. 3 is similar to FIG. 1 but with a cone-shaped encapsulation.

The encapsulation 190a is disposed on the surface 112 of the substrate and covers the LED chip 150, the first reflective portion 172a and a portion of the second reflective portion 174. The encapsulation 190a is configured for converging a direction of the light emitted from the LED chip 150, thus adjusting an illuminating scope of the LED 100. In addition, the encapsulation 190a protects the LED chip 150 from contaminants. A refractive index of the encapsulation 190a is, for example, in an approximate range of 1.4 to 1.55. The encapsulation 190a can be made of a light-permeable material including but not limited to cyclic olefin copolymer (COC), polymethylmethacrolate (PMMA), polycarbonate (PC), PC and/or PMMA, and polyetherimide (PIE). The encapsulation 190a can be hemisphere-shaped. The encapsulation 190a also can be other shapes known in the art having light gathering function, such as a cone-shaped lens 190b having an aspheric surface, referring to FIG. 3.

Figure 4:
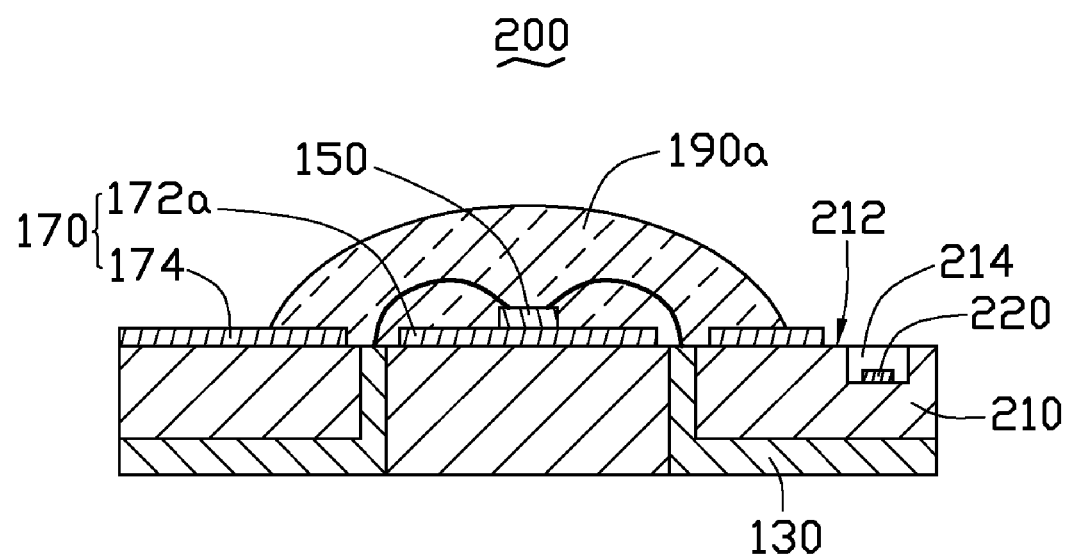
FIG. 4 is a schematic, cross-sectional view of a light-emitting diode in accordance with a second embodiment, including a blind via covered by an encapsulation.

Referring to FIG. 4, an LED 200 according to a second embodiment is shown. The structure of the LED 200 is similar with that of the LED 100 in the first embodiment. The LED 200 includes a silicon substrate 210, an LED chip 150, and a light pervious encapsulation 190a. The difference is that a blind via 214 is defined in the surface 212 of the substrate 210. The blind via 214 is exposed to the outside of the encapsulation 190a. An auxiliary electric component 220 is completely received in the blind via 214 positioned below the surface 212 of the silicon substrate 110. Hence, the auxiliary electric component 220 does not absorb/block light emitted from the LED chip 150. All the light emitted from the LED chip 150 can reach the encapsulation 190a. As a result, the brightness and the luminous efficiency of the LED 200 are stably maintained.

In the present embodiment, the auxiliary electric component 220 is an anti-static electric component, such as a zener diode, a Schottky barrier diode (SND), a silicon-based tunneling diode, an integrated circuit for static electricity protection and so on. The auxiliary electric component 220 is electrically connected with the LED chip 150 in parallel (not shown) so that the auxiliary electric component 220 prevents the LED chip 150 from reverse breakdown caused by static electricity.

Figure 5:
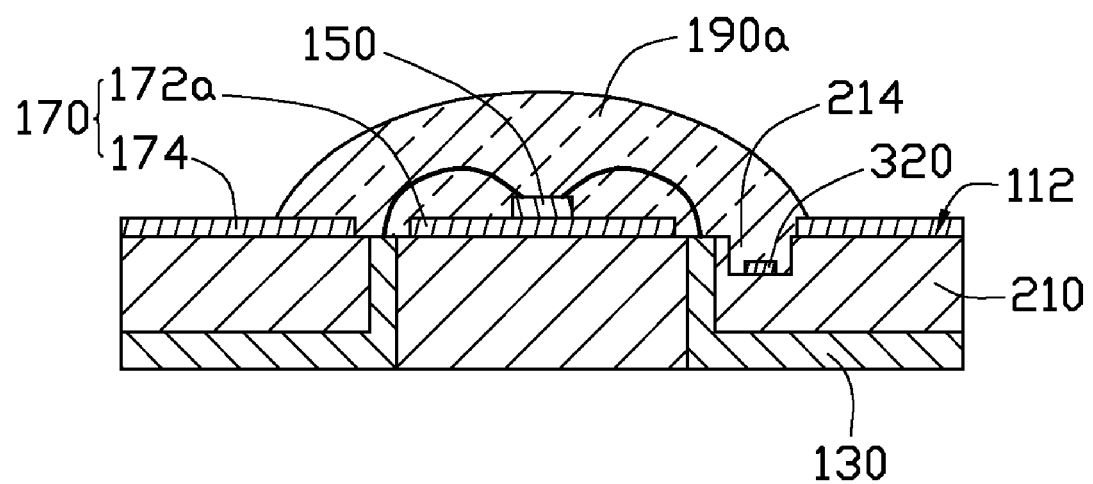
FIG. 5 is similar to FIG. 4 but with the blind via located outside of the encapsulation.

Referring to FIG. 5, the auxiliary electric component 320 can be a light intensity sensor. The blind via 214 is defined in the surface 112 of the substrate 210 and inside the coverage of the encapsulation 190a, so that the auxiliary electric component 320 can precisely measure the light intensity of the LED chip 150. It should be noted that the light intensity sensor can be connected with a feedback circuit (not shown) for stabilizing the intensity of the LED chip 150.

In the first and second embodiments, the reflective layer 170 can be replaced by a fluorescent layer made of fluorescent materials. The fluorescent layer is configured for providing light of a desirable color.

While the present invention has been described as having preferred or exemplary embodiments, the embodiments can be further modified within the spirit and scope of this disclosure. This application is therefore intended to cover any variations, uses, or adaptations of the embodiments using the general principles of the invention as claimed. Further, this application is intended to cover such departures from the present disclosure as come within known or customary practice in the art to which the invention pertains and which fall within the limits of the appended claims or equivalents thereof.

What is claimed is:

1. An LED comprising:
   a substrate having a substantially flat substrate surface;
   a plurality of electrodes extending through the substrate;
   an LED chip for emitting light, the LED chip mounted on the substrate surface and electrically connected with the electrodes;
   a first and a second coplanar reflective layers formed on the substrate surface and configured for reflecting the light emitted from the LED chip, the first reflective layer being sandwiched between the LED chip and the substrate surface and insulated from the electrodes; and
   a light pervious encapsulation member mounted on the substrate surface, and the encapsulation member covering the LED chip and the first reflective layer and a portion of the second reflective layer.

2. The LED of claim 1, further comprising an accommodating recess defined in the substrate surface, and an auxiliary electric component received in the accommodating recess.

3. The LED of claim 2, wherein the auxiliary electric component is an anti-static electric component.

4. The LED of claim 2, wherein the auxiliary electric component is a light intensity sensor.

5. The LED of claim 4, wherein the accommodating recess and the light intensity sensor are covered by the light pervious encapsulation member.

6. The LED of claim 4, wherein the accommodating recess and the light intensity sensor are located outside the light pervious encapsulation member.

7. The LED of claim 3, wherein the anti-static electric component is selected from the group consisting of a zener diode, a Schottky barrier diode, a silicon-based tunneling diode, and an integrated circuit for static electricity protection.

8. The LED of claim 3, wherein the anti-static electric component is electrically connected with the LED chip in parallel.

9. The LED of claim 1, wherein the substrate is comprised of silicon material.

10. The LED of claim 1, wherein the first reflective layer has an opening defined therein, and the LED chip is disposed in the opening and surrounded by the first reflective layer.

11. The LED of claim 1, wherein the first reflective layer or the second reflective layer is comprised of metal.

12. The LED of claim 1, wherein the first reflective layer and the second reflective layer is insulated from the electrodes.

13. The LED of claim 1, wherein the light pervious encapsulation member is hemispherical in shape.

14. The LED of claim 1, wherein the light pervious encapsulation member is a cone-shaped lens having an aspheric surface.

15. An LED comprising:
   a silicon substrate having a substantially flat substrate surface;
   a plurality of electrodes extending through the silicon substrate;
   an LED chip electrically connected with the electrodes for emitting light, the LED chip mounted on the substrate surface and located outside of the silicon substrate;
   a reflective layer formed on the substrate surface and configured for reflecting the light emitted from the LED chip, the reflective layer directly and mechanically contacting the substrate surface and the LED chip at opposite surfaces thereof and a light pervious encapsulation member formed on the substrate surface, and covering the LED chip, the LED chip enveloped between the reflective layer and encapsulation member.

16. The LED of claim 15, wherein ends of the plurality of electrodes exposed out the substrate surface are located at opposite sides of and spaced from the reflective layer, wires interconnecting the LED chip and the ends of the electrodes.

17. The LED of claim 15, wherein the reflective layer is insulated from the electrodes.

18. The LED of claim 15, further comprising an additional reflective layer located beside and spaced from the reflective layer.

19. The LED of claim 1, wherein the first reflective layer directly and mechanically contacts the substrate surface and the LED chip at opposite surfaces thereof.

20. The LED of claim 1, further comprising two wires, wherein the second reflective layer is located beside and spaced from the first reflective layer, the wires extending through a gap between the first and second reflective layers to connect the LED chip and the electrodes.

* * * * *